US012131961B2

(12) United States Patent
Lin

(10) Patent No.: US 12,131,961 B2
(45) Date of Patent: Oct. 29, 2024

(54) ADHESION DEVICE, MICRO DEVICE OPTICAL INSPECTION AND REPAIRING EQUIPMENT AND OPTICAL INSPECTION AND REPAIRING METHOD

(71) Applicant: PlayNitride Display Co., Ltd., MiaoLi County (TW)

(72) Inventor: Cheng-Cian Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 306 days.

(21) Appl. No.: 17/739,220

(22) Filed: May 9, 2022

(65) Prior Publication Data

US 2022/0262688 A1 Aug. 18, 2022

Related U.S. Application Data

(62) Division of application No. 16/726,177, filed on Dec. 23, 2019, now Pat. No. 11,355,402.

(30) Foreign Application Priority Data

Aug. 14, 2019 (TW) .................................. 108128876

(51) Int. Cl.
*H01L 21/66* (2006.01)
*G01B 11/00* (2006.01)
(Continued)

(52) U.S. Cl.
CPC .............. *H01L 22/22* (2013.01); *G01B 11/00* (2013.01); *H01L 21/67011* (2013.01); *H01L 21/67288* (2013.01); *H01L 25/0753* (2013.01)

(58) Field of Classification Search
CPC .... G01N 21/956; G01N 21/88; G01N 21/958; G01N 21/9501; G01N 21/8851; G01B 11/00; H01L 21/67011; H01L 21/67288; H01L 22/12; H01L 22/20; H01L 22/22; H01L 25/0753
(Continued)

(56) References Cited

U.S. PATENT DOCUMENTS

| 6,583,871 | B1 * | 6/2003 | Rangarajan | .......... G01N 21/956 356/237.4 |
| 2006/0108338 | A1 * | 5/2006 | Nishiwaki | .......... B23K 26/0622 219/121.72 |
| 2018/0019229 | A1 * | 1/2018 | Chen | ................... H01L 25/0657 |

FOREIGN PATENT DOCUMENTS

WO WO-2012086158 A1 * 6/2012 ........... G02F 1/1309

\* cited by examiner

*Primary Examiner* — Sunghee Y Gray
(74) *Attorney, Agent, or Firm* — JCIPRNET

(57) ABSTRACT

Micro device optical inspection and repairing equipment adopting an adhesion device is provided. The micro device optical inspection and repairing equipment includes a carrying stage, an optical inspection module and at least one adhesion device. The optical inspection module is arranged corresponding to the carrying stage so as to capture image information and obtain a position coordinate from the image information. The adhesion device includes a main body and an adhesive portion. The adhesive portion is connected to the main body. The adhesion device can move to a target position of the carrying stage according to the position coordinate. The main body is adapted to drive the adhesive portion to move to the target position along a moving axis. An optical inspection and repairing method adopting the micro device optical inspection and repairing equipment is also provided.

4 Claims, 9 Drawing Sheets

(51) Int. Cl.
*H01L 21/67* (2006.01)
*H01L 25/075* (2006.01)

(58) Field of Classification Search
USPC .................................. 356/394, 237.1, 2, 4, 5
See application file for complete search history.

ADHESION DEVICE, MICRO DEVICE OPTICAL INSPECTION AND REPAIRING EQUIPMENT AND OPTICAL INSPECTION AND REPAIRING METHOD

CROSS-REFERENCE TO RELATED APPLICATION

This application is a divisional application of U.S. application Ser. No. 16/726,177, filed on Dec. 23, 2019, now allowed, which claims the priority benefit of Taiwan application serial no. 108128876, filed on Aug. 14, 2019. The entirety of each of the above-mentioned patent applications is hereby incorporated by reference herein and made a part of this specification.

BACKGROUND

1. Technical Field

The disclosure generally relates to a flaw inspection and repairing technique, and in particular, to an adhesion device, micro device optical inspection and repairing equipment and an optical inspection and repairing method.

2. Description of Related Art

In recent years, in the case that the manufacturing cost of an organic light emitting diode (OLED) display panel is relatively high, and the lifetime and the reliability of the OLED display panel cannot compete with an existing mainstream display, a micro LED display gradually attracts various scientific and technical manufacturers to make an investment. In addition to the advantages of low energy consumption and long material service life, the micro LED display also has excellent optical performance, such as high color saturation, high response speed and high contrast.

On the other hand, in order to achieve lower production cost and larger product design margin, a manufacturing technique of the micro LED display adopts a chip transfer mode, that is, a mass transfer technique, to directly transfer fabricated micro LED chips to a driving circuit backplane. Specifically, a chip manufacturer needs to firstly make (or place) micro LED chips on a temporary substrate, and then to transfer the micro LED chips stored on the temporary substrate to driving circuit boards of different products according to different application requirements.

However, in the processes of producing the micro LED chips, it is inevitable to have a certain number of abnormal micro LED chips. Therefore, how to remove these abnormal micro LED chips to improve the yield of end products has become an important issue for related manufacturers.

SUMMARY

The disclosure provides an adhesion device with high repair rate.

The disclosure provides micro device optical inspection and repairing equipment with high repair yield.

The disclosure provides an optical inspection and repairing method with low cost of inspection and repairing and high maintenance success rate.

The micro device optical inspection and repairing equipment of the disclosure includes a carrying stage, an optical inspection module and at least one adhesion device. The optical inspection module is arranged corresponding to the carrying stage so as to capture image information and obtain a position coordinate from the image information. The adhesion device includes a main body and an adhesive portion. The adhesive portion is connected to the main body. The adhesion device can move to a target position of the carrying stage according to the position coordinate. The main body is adapted to drive the adhesive portion to move to the target position along a moving axis.

In one embodiment of the disclosure, the optical inspection module of the above micro device optical inspection and repairing equipment includes an image capturing element and an image processing device. The image capturing element is used to capture the image information. The image processing device is coupled to the image capturing element and is used to analyze the image information to obtain the position coordinate.

In one embodiment of the disclosure, the above micro device optical inspection and repairing equipment further includes at least one moving mechanism, and the image capturing element and the adhesion device are arranged on the moving mechanism. The moving mechanism is adapted to drive the image capturing element and the adhesion device to move relative to the carrying stage.

In one embodiment of the disclosure, the image capturing element of the above micro device optical inspection and repairing equipment includes a lens module and an image sensor. The image sensor is coupled to the image processing device. The lens module is located between the carrying stage and the image sensor.

In one embodiment of the disclosure, the optical inspection module of the above micro device optical inspection and repairing equipment includes a thickness detector used to measure height information of the target position of the carrying stage.

In one embodiment of the disclosure, the adhesion device of the above micro device optical inspection and repairing equipment further includes a cushion layer connected to the main body, and the Young's modulus of the cushion layer is less than that of the adhesive portion.

In one embodiment of the disclosure, the above micro device optical inspection and repairing equipment further includes a carrier and a plurality of adhesion devices arranged on the carrier. The carrier is arranged on the moving mechanism.

In one embodiment of the disclosure, the cushion layer of the above micro device optical inspection and repairing equipment is connected between the adhesive portion and the main body.

In one embodiment of the disclosure, a material of the adhesive portion of the above micro device optical inspection and repairing equipment includes a silica gel-based material or an acryl-based material.

The optical inspection and repairing method of the disclosure includes: providing micro device optical inspection and repairing equipment; placing an object under test on a carrying stage of the micro device optical inspection and repairing equipment; performing optical inspection on the object under test with an optical inspection module to determine if a flaw existed in the object under test; obtaining a position coordinate of the flaw after the flaw is determined; and moving an adhesion device over a target position, which corresponds to the position coordinate of the flaw, on the carrying stage. A main body of the adhesion device is adapted to drive an adhesive portion to move to the target position along a moving axis, so that the flaw is adhered with the adhesive portion and then removed from the object under test.

In one embodiment of the disclosure, the above optical inspection and repairing method further includes: performing ultrasonic cleaning on the adhesion device to remove the flaw from the adhesion device.

In one embodiment of the disclosure, the above optical inspection and repairing method further includes: determining the cleanliness of the adhesion device; and drying the adhesion device after determining that the adhesion device is not adhered with any flaw.

In one embodiment of the disclosure, the object under test of the above optical inspection and repairing method is a micro element wafer and includes a substrate and a plurality of micro elements. The micro elements are arranged on the substrate, and the flaw is bad one of the micro elements.

In one embodiment of the disclosure, the object under test of the above optical inspection and repairing method further includes a cushion layer arranged between the substrate and the plurality of micro elements.

The adhesion device of the disclosure is suitable for being adhered with the micro element, and the adhesion device includes the main body and the adhesive portion. The adhesive portion is connected to the main body and suitable for being adhered with the micro element. A material of the adhesive portion includes a silica gel-based material or an acryl-based material, and a diameter of the adhesive portion is less than 250 μm.

In one embodiment of the disclosure, the above adhesion device further includes a cushion layer connected to the main body, and the Young's modulus of the cushion layer is less than that of the adhesive portion.

In one embodiment of the disclosure, the cushion layer of the above adhesion device is connected between the adhesive portion and the main body.

In one embodiment of the disclosure, the cushion layer of the above adhesion device is connected to an end of the main body, the end being opposite to the adhesive portion.

In one embodiment of the disclosure, an outline of the adhesive portion of the adhesion device is of an arc, elliptical arc or polyline shape.

Based on the above, in the micro device optical inspection and repairing equipment and optical inspection and repairing method of one embodiment of the disclosure, the optical inspection module is utilized to perform optical inspection on the object under test to obtain the position coordinate of the flaw, which is conducive to ensure a positioning relationship between the adhesion device and the flaw, thereby improving the accuracy of the flaw removal. In another aspect, the flaw can be effectively removed from the object under test through an adhering relationship between the adhesion device and the flaw so as to increase the repair yield, thereby improving the overall yield of a post-process.

In order to make the aforementioned and other objectives and advantages of the disclosure comprehensible, embodiments accompanied with figures are described in detail below.

DESCRIPTION OF THE EMBODIMENTS

Figure 1:
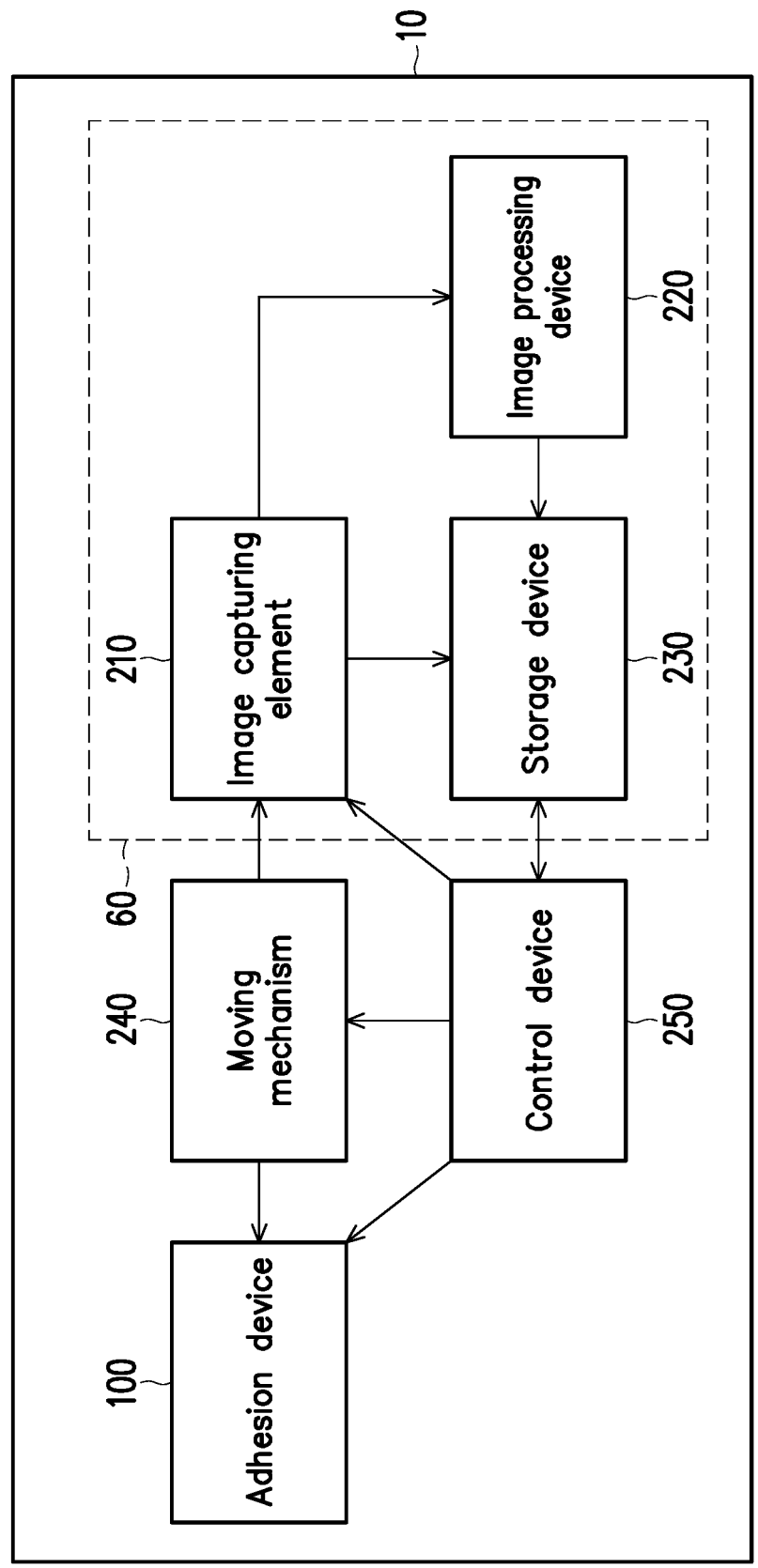
FIG. 1 is a block diagram of micro device optical inspection and repairing equipment according to the first embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
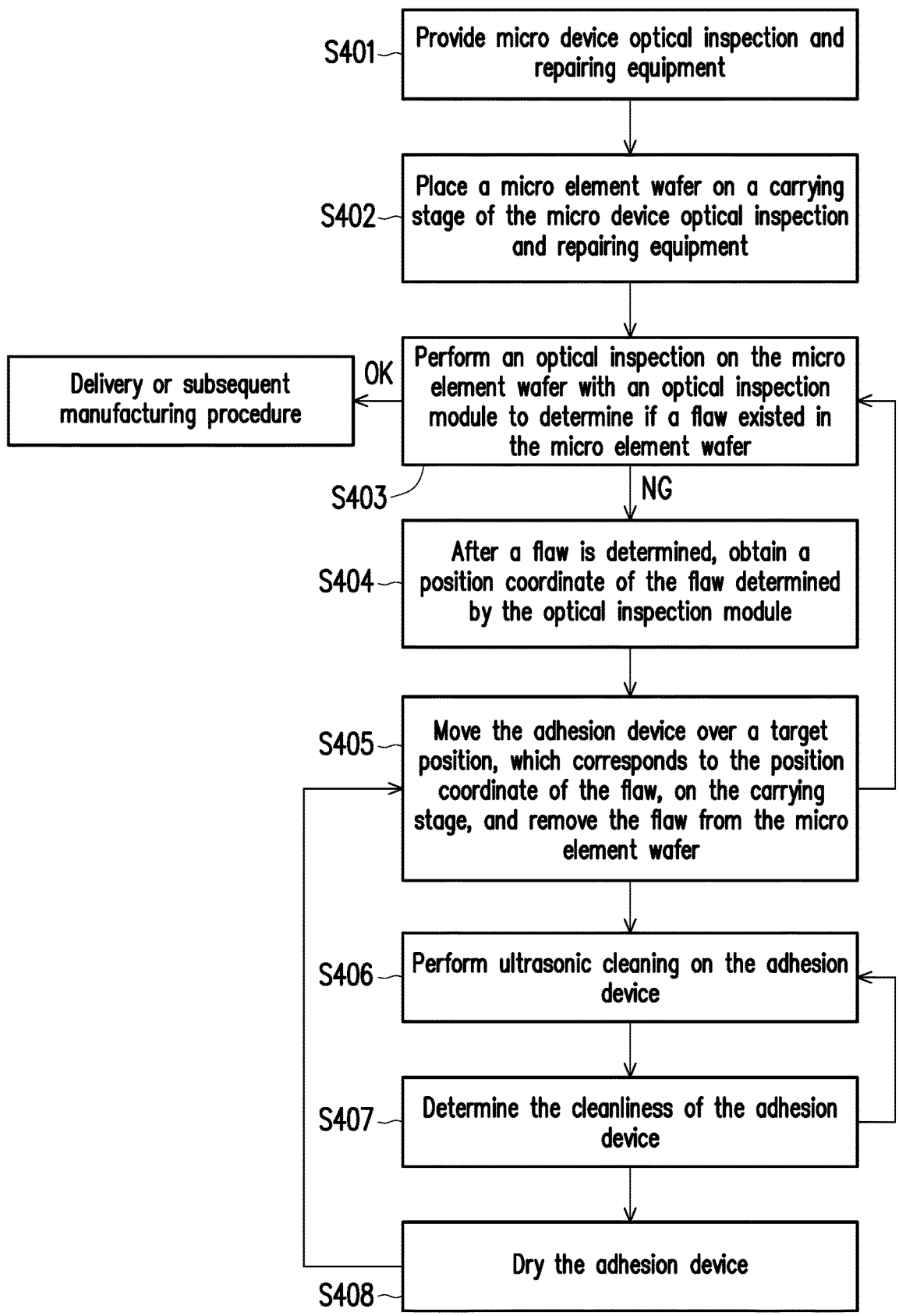
FIG. 2 is a flow diagram of an optical inspection and repairing method according to the first embodiment of the disclosure.
Figure 3A:
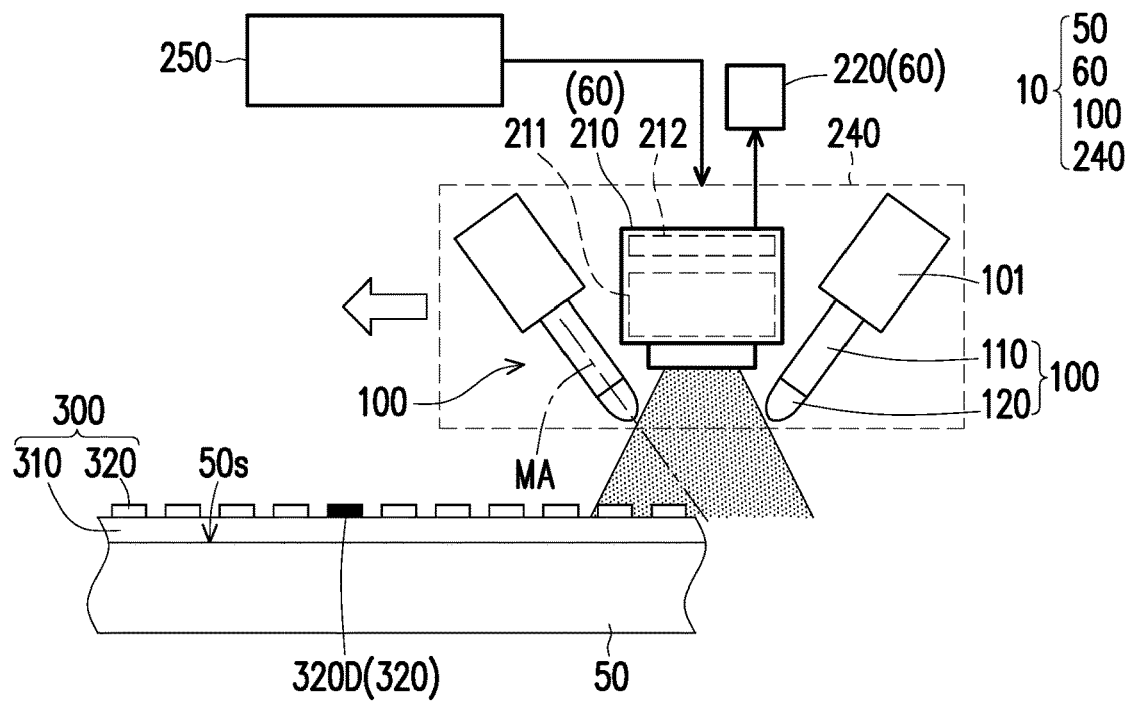
FIGS. 3A to 3D are schematic diagrams of an optical inspection and repairing flow according to the first embodiment of the disclosure.

FIG. 1 is a block diagram of micro device optical inspection and repairing equipment according to the first embodiment of the disclosure. FIG. 2 is a flow diagram of an optical inspection and repairing method according to the first embodiment of the disclosure. FIGS. 3A to 3D are schematic diagrams of an optical inspection and repairing flow according to the first embodiment of the disclosure. It should be particularly illustrated that for clear presentation, illustration of a storage device 230 of FIG. 1 is omitted in FIG. 3A, and illustrations of a lens module 211 and an image sensor 212 of FIG. 3A are omitted in FIGS. 3B to 3D.

Referring to FIGS. 1 and 3A, the micro device optical inspection and repairing equipment 10 includes a carrying stage 50 and an optical inspection module 60. An object under test 300 is placed on the carrying stage 50. The optical inspection module 60 is arranged on the carrying stage 50, and the object under test 300 is arranged between the optical inspection module 60 and the carrying stage 50. In the present embodiment, the object under test 300 is, for example, a micro element wafer, which includes a substrate 310 and a plurality of micro light emitting diodes (micro LEDs) 320, and these micro LEDs 320 are arranged on the substrate 310. It should be understood that the embodiment of the disclosure is not limited thereto. Some embodiments may also be applied to the micro element wafer with other micro devices, like micro IC, micro transistor unit and so on.

According to the above, the optical inspection module 60 is used to capture image information about the object under test 300 and obtain a position coordinate of a flaw 320D from the image information. In the present embodiment, the flaw 320D is one of the micro LEDs 320, which cannot be enabled or has a surface defect, but the disclosure is not limited thereto. In other embodiments, the flaw 320D may also be a particle or dust that come from environment. It should be noted that the present embodiment takes one flaw 320D as an example for exemplary description, and is not indicative that the disclosure is limited to content disclosed in the drawings. According to other embodiments, multiple flaws 320D may also exist.

In the present embodiment, the optical inspection module 60 includes an image capturing element 210 and an image processing device 220. The image capturing element 210 is used to capture the image information about the object under test 300. For example, the image capturing element 210 may include a lens module 211 and an image sensor 212. The lens module 211 is located between the carrying stage 50 and the image sensor 212. The image sensor 212 includes, for example, a charge coupled device (CCD) or a complementary metal-oxide semiconductor (CMOS) element. The image processing device 220 is coupled to the image sensor 212 of the image capturing element 210 and is used to analyze the image information to obtain the position coordinate of the flaw 320D. In the present embodiment, the optical inspection module 60 may also include a storage device 230 (as illustrated in FIG. 1), and is used to store the image information captured by the image capturing element 210 or an analysis result (such as the position coordinate of the flaw 320D) obtained by the image processing device 220 for the above image information.

Particularly, in order to remove the flaw 320D from the object under test 300, the micro device optical inspection and repairing equipment 10 is also provided with adhesion devices 100, and the object under test 300 is arranged between the adhesion devices 100 and the carrying stage 50. Further, each adhesion device 100 includes a main body 110 and an adhesive portion 120. One end of the main body 110 is connected to the adhesive portion 120, and the other end of the main body 110 may be connected to a carrier 101. For example, the main body 110 is connected to the carrier 101 and slides along a moving axis MA (as illustrated in FIG. 3B), and the adhesive portion 120 is adapted to be driven by the main body 110 to move to the object under test 300 along the moving axis MA.

In the present embodiment, an angle less than 90 degrees is included between the moving axis MA and the carrying stage 50 (or the substrate 310). That is, moving path of the main body 110 is not perpendicular to the upper surface 50s of the carrying stage 50, but is inclined to the upper surface 50s of the carrying stage 50. However, the disclosure is not limited thereto. In the present embodiment, the material of the adhesive portion 120 may include a silica gel-based material or an acryl-based material. In addition, the outline of the adhesive portion 120 is, for example, of an (semi) elliptical arc shape, but the disclosure is not limited thereto. In other embodiments, the outline of the adhesive portion 120 may also be adjusted for need of the micro element structure.

Figure 3B:
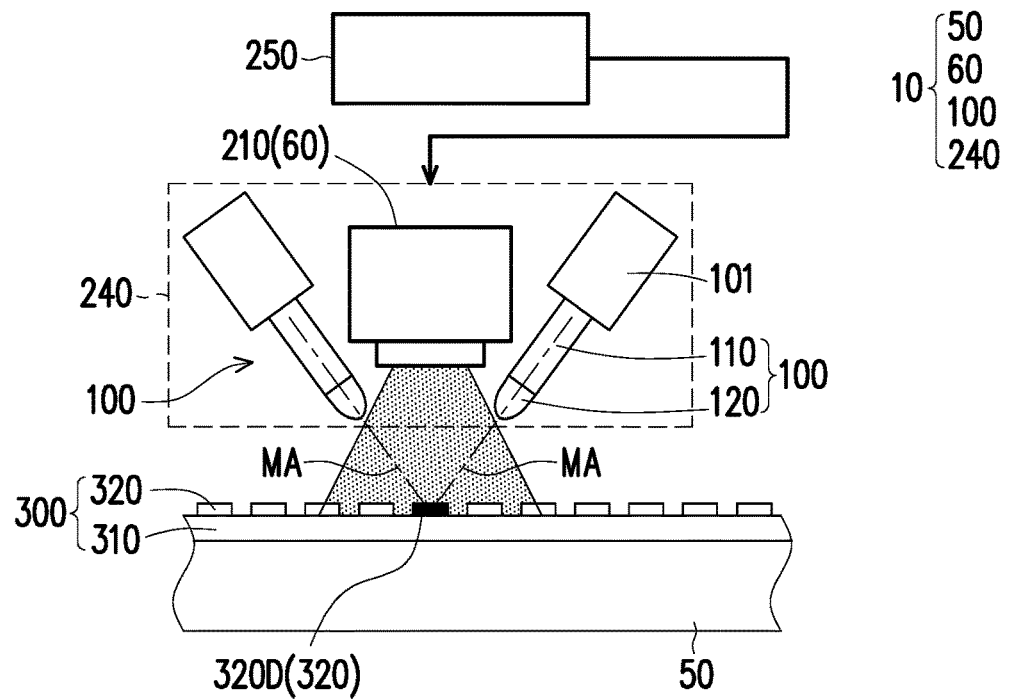

Further, in the present embodiment, two adhesion devices 100 are respectively arranged on two opposite sides of the image capturing element 210, and the moving axes MA of two main bodies 110 may pass through the same micro element 320 (as illustrated in FIG. 3B). Accordingly, the positioning relationship between the adhesion devices 100 and the flaw 320D may be simplified. For example, when the object under test 300 has two flaws 320D, the positioning relationship between the two adhesion devices 100 and the two flaws 320D may be simplified from a "2 points-to-2 points" into a "1 position-to-2 points".

It should be noted that two adhesion devices 100 of the present embodiment are exemplarily described, but the disclosure is not limited thereto. According to other embodiments, the micro device optical inspection and repairing equipment may also include multiple adhesion devices 100. The multiple adhesion devices 100 are arranged around the image capturing element 210.

Further, the micro device optical inspection and repairing equipment 10 may also include a moving mechanism 240 and a control device 250. In the present embodiment, the adhesion devices 100 and the image capturing element 210 are arranged on the same moving mechanism 240. The moving mechanism 240 is adapted to drive the adhesion devices 100 (or the image capturing element 210) to move to the flaw 320D (or the target position, which corresponds to the flaw 320D, on the carrying stage 50) according to the position coordinate of the flaw 320D, but the disclosure is not limited thereto. For example, the control device 250 is used to receive setting instructions through a human-machine interface, and drive the optical inspection module 60, the adhesion devices 100 and the moving mechanism 240 according to preset process parameters or real-time feedback in a manufacturing process. An optical inspection and repairing method applicable to the micro device optical inspection and repairing equipment 10 will be exemplarily illustrated below.

Referring to FIGS. 2 and 3A, firstly, the micro device optical inspection and repairing equipment 10 is provided (Step S401), and a micro element wafer (the object under test) 300 (such as a micro LEDs array carrier) is placed on the carrying stage 50 of the micro device optical inspection and repairing equipment 10 (Step S402). For example, the micro element wafer 300 may be transported onto the carrying stage 50 by using a mechanical arm or a conveyer belt. After the micro element wafer 300 is stably placed on the carrying stage 50, the optical inspection module 60 performs optical inspection on the micro element wafer 300 to determine if a flaw 320D existed in the micro element wafer 300 (Step S403). If no flaw 320D is detected, the micro element wafer 300 may be treated in a subsequent manufacturing procedure or be directly delivered to a client. On the contrary, if a flaw 320D is detected, the optical inspection module 60 further obtains a corresponding position coordinate thereof (Step S404), as illustrated in FIGS. 2 and 3B. It should be understood that if multiple flaws 320D are detected, the position coordinates of the multiple flaws 320D may be obtained.

Figure 3C:
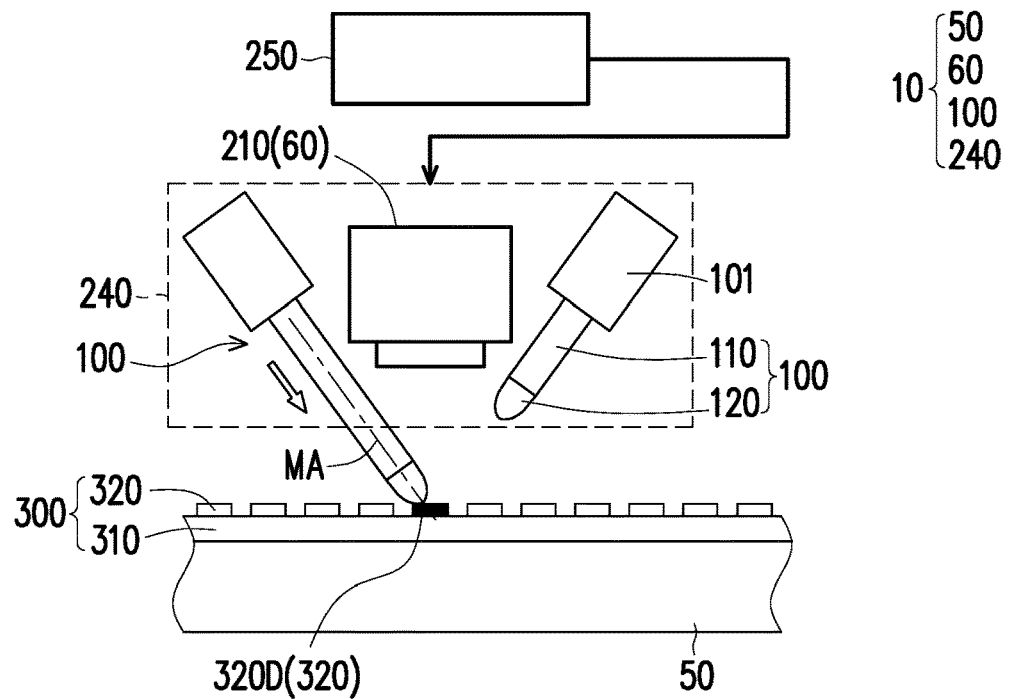
Figure 3D:
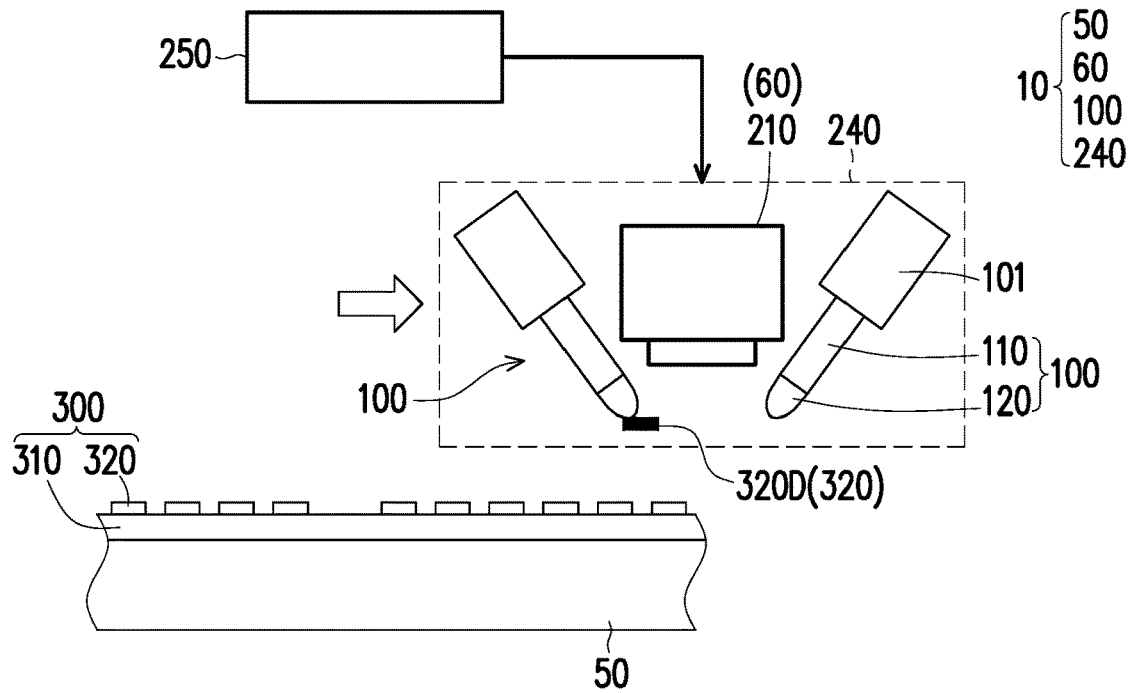

Referring to FIGS. 2, 3C and 3D, then the adhesion devices 100 are enabled to move to the target position, which corresponds to the flaw 320D, on the carrying stage 50 according to the obtained position coordinates, and the flaw 320D is removed from the micro element wafer 300 through an adhesive force between the adhesion devices 100 and the flaw 320D (Step S405). Specifically, when the movement of the adhesion devices 100 relative to the flaw 320D is finished, the moving axes MA of the main bodies 110 may pass through the flaw 320D. Next, the main bodies 110 of the adhesion devices 100 drive adhesive portions 120 to move to the flaw 320D along the moving axes MA. After the adhesive portions 120 adhered to the flaw 320D, the main bodies 110 are driven to drive the adhesive portions 120 and the flaw 320D to get away from the substrate 310 (namely to move toward the carrier 101) along the moving axes MA.

It should be particularly noted that in the present embodiment, the inspection and repairing method illustrated in FIG. 2 (i.e., a mode of firstly performing inspection and then performing repairing) is adopted by the micro device optical inspection and repairing equipment 10, but the disclosure is not limited thereto. According to other embodiments, the flaw 320D may be immediately removed from the micro element wafer 300 through the adhesion devices 100 once a flaw 320D is detected due to that the image capturing element 210 and the adhesion devices 100 of the micro device optical inspection and repairing equipment 10 are arranged on the same moving mechanism 240. That is, the micro device optical inspection and repairing equipment 10 may also be operated in a manner that inspection and repairing are synchronized. Accordingly, the efficiency of repair process may be increased.

After the flaw 320D is removed, another optical inspection may be performed on the micro element wafer 300 (Step S403) so as to determine whether the object under test 300 still has a flaw 320D. If a flaw 320D still exists, the above steps S405 and S404 may be repeated, so that the micro element wafer 300 may further be treated in a subsequent manufacturing procedure or be directly delivered to a client. It is worth mentioning that in the present embodiment, the optical inspection and repairing method may also include that ultrasonic cleaning is performed on the adhesion devices 100 adhered with the flaws 320D to remove the flaws 320D from the adhesive portions 120 of the adhesion devices 100 (Step S406). Furthermore, after the ultrasonic cleaning is completed, confirming that the flaws 320D on the adhesion devices 100 are cleaned up or not. That is to say, the cleanliness of the adhesion devices 100 is confirmed after the ultrasonic cleaning (Step S407). If flaws 320D still be found on the adhesion devices 100, the above steps S406 and S407 may be repeated till the flaws 320D are completely removed from the adhesion devices 100.

Further, after confirming that the adhesion devices 100 are not adhered with any flaw 320D, a drying step for the adhesion devices 100 may also be performed (Step S408) so as to dry the adhesive portions 120. For example, in the present embodiment, the material of the adhesive portions 120 may be silicone rubber whose surficial adhesiveness can be reduced by rinsing the adhesion portion 120 with an aqueous solution so as to achieve the aim of cleaning the surfaces of the adhesive portions 120. However, the disclosure is not limited thereto. In other embodiments, the adhesive portion 120 may also be cleaned with a volatile solution (or ultrasonically cleaned). That is, after confirming that the adhesion device 100 is not adhered with any flaw 320D, the drying step for the adhesion device 100 may further be omitted. It is worth mentioning that the cleaned adhesion device 100 may also be used for removing a flaw 320D on the micro element wafer 300 (namely, Step S405). That is, the adhesion device 100 has a reusable feature to reduce process cost.

Figure 4A:
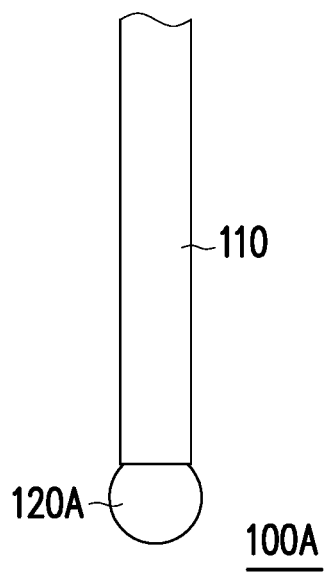
FIGS. 4A to 4E are schematic diagrams of an adhesion device according to other embodiments of the disclosure.
Figure 4B:
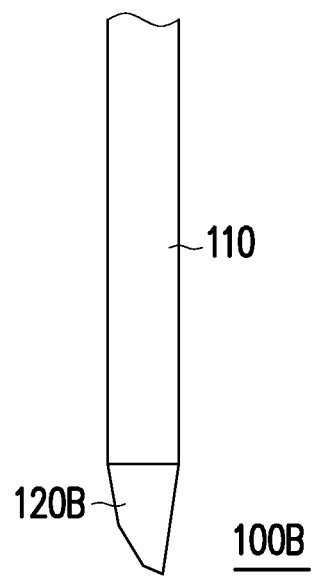
Figure 4C:
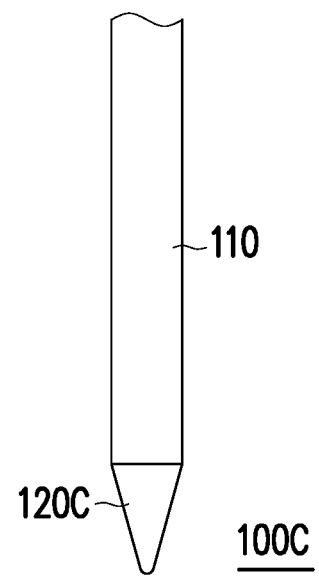

FIGS. 4A to 4E are schematic diagrams of adhesion devices according to other embodiments of the disclosure. Referring to FIGS. 4A to 4C, a main difference between adhesion devices of these embodiments and the adhesion devices 100 of FIG. 3A lies in different outlines of the adhesive portions 120. For example, the outline of an adhesive portion 120A of an adhesion device 100A is of an (semi) arc shape (as illustrated in FIG. 4A); the outline of an adhesive portion 120B of an adhesion device 100B is of a polyline shape (as illustrated in FIG. 4B); and the outline of an adhesive portion 120C of an adhesion device 100C is of a combination shape of two straight line segments and an arc line segment (as illustrated in FIG. 4C).

Figure 4D:
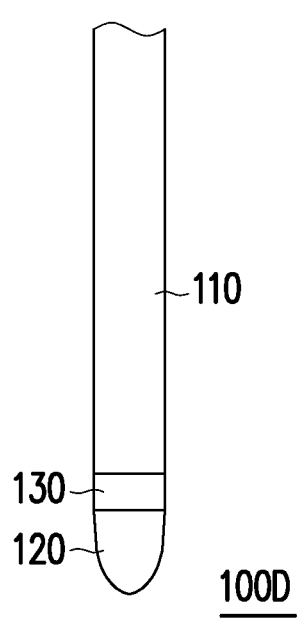
Figure 4E:
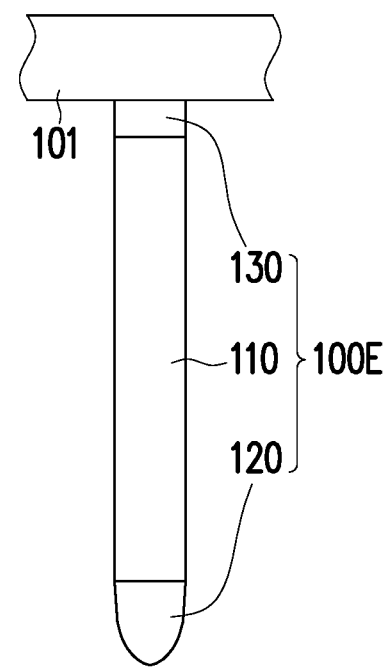

Referring to FIGS. 4D and 4E, further, the adhesion device may also include a cushion layer 130. The cushion layer 130 is connected to the main body 110, and the Young's modulus of the cushion layer 130 is less than that of the adhesive portion 120. For example, in one embodiment, the cushion layer 130 of an adhesion device 100D may be arranged between the main body 110 and the adhesive portion 120 (as illustrated in FIG. 4D). In another embodiment, the cushion layer 130 of an adhesion device 100E may also be arranged between the main body 110 and a carrier 101 (as illustrated in FIG. 4E). However, the disclosure is not limited thereto. According to other embodiments, a cushion layer 130 may also be arranged between a carrying stage 50 and a micro element 320. For example, the cushion layer 130 may be connected between the substrate 310 and the micro element 320 (or between the carrying stage 50 and the substrate 310).

Figure 5:
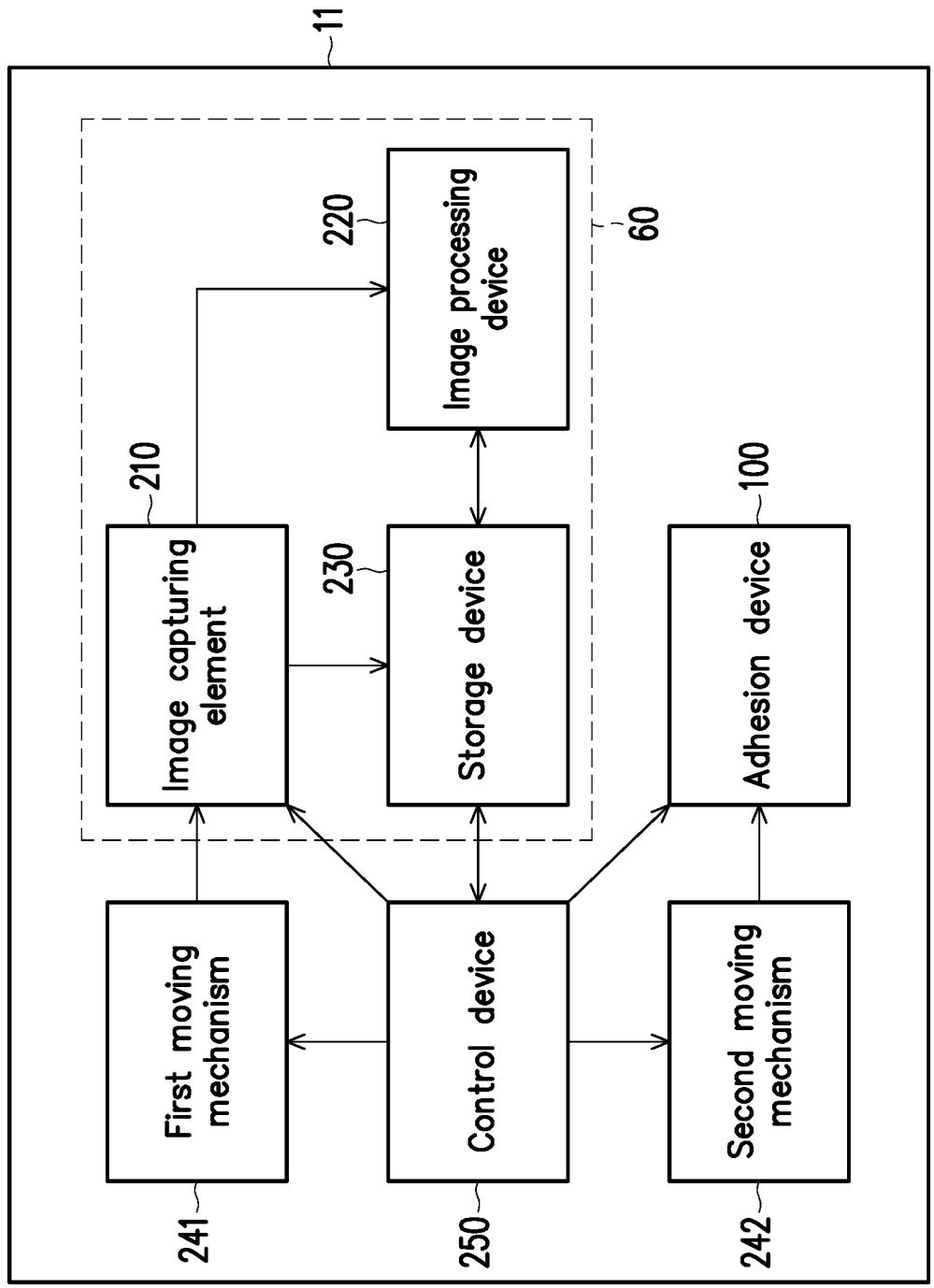
FIG. 5 is a block diagram of micro device optical inspection and repairing equipment according to the second embodiment of the disclosure.
Figure 6A:
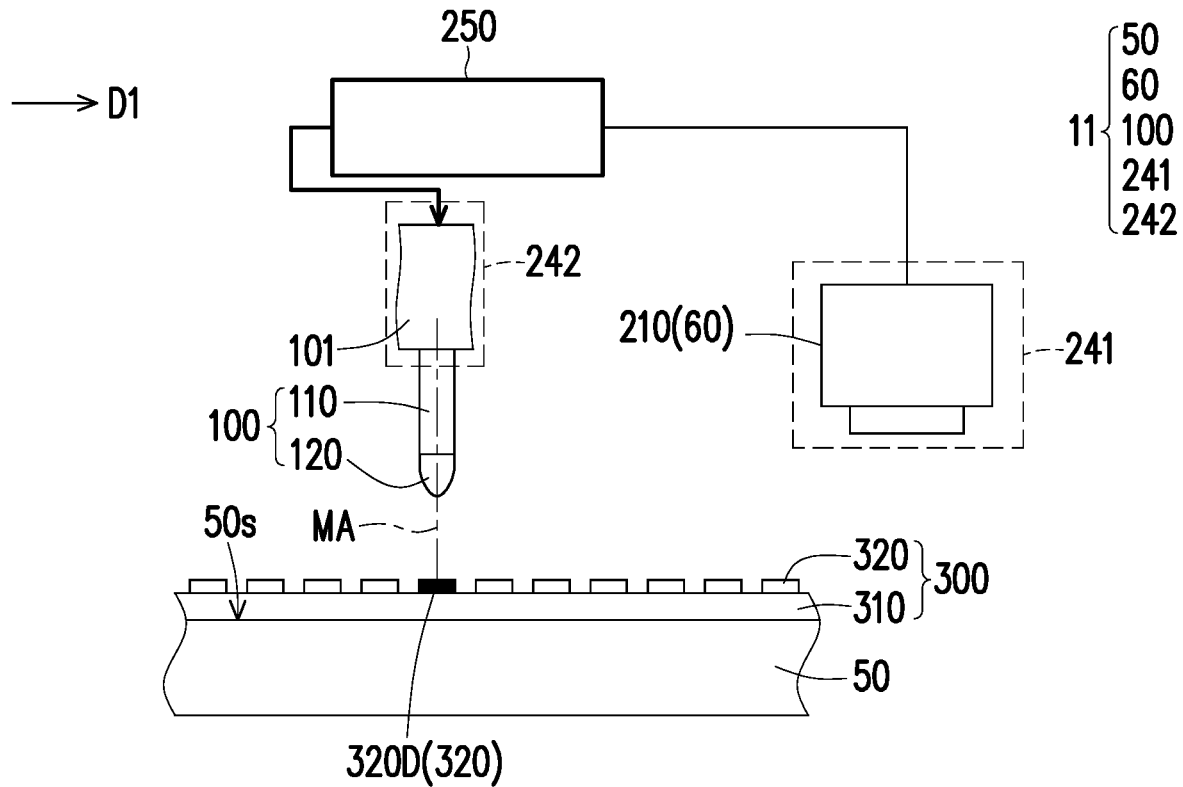
FIG. 6A is an operation schematic diagram of an adhesion device according to the second embodiment of the disclosure.
Figure 6B:
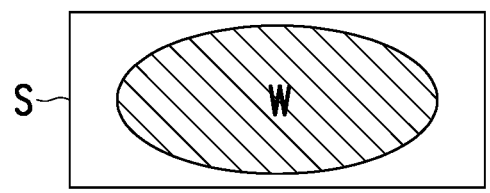
FIG. 6B is a schematic diagram of vertical projections of a micro element and an adhesive portion of FIG. 6A on a carrying stage.

FIG. 5 is a block diagram of micro device optical inspection and repairing equipment according to the second embodiment of the disclosure. FIG. 6A is an operation schematic diagram of an adhesion device according to the second embodiment of the disclosure. FIG. 6B is a schematic diagram of vertical projections of a micro element and an adhesive portion of FIG. 6A on a carrying stage. Referring to FIGS. 5 and 6A, a main difference between the micro device optical inspection and repairing equipment 11 of the present embodiment and the micro device optical inspection and repairing equipment 10 of FIGS. 1 and 3A lies in the quantity of the moving mechanism and the configuration of the adhesion devices 100. Specifically, the micro device optical inspection and repairing equipment 11 includes a first moving mechanism 241 and a second moving mechanism 242. An image capturing element 210 and an adhesion device 100 are respectively arranged on the first moving mechanism 241 and the second moving mechanism 242. That is, the image capturing element 210 and the adhesion device 100 may move independently to improve inspection rate or meet different requirements of inspection and repairing.

In the present embodiment, the moving axis MA of a main body 110 of an adhesion device 100 may be perpendicular to the upper surface 50s of a carrying stage 50. In another aspect, a micro element 320 and an adhesive portion 120 respectively have a vertical projection S and a vertical projection W (as illustrated in FIG. 6B) on the carrying stage 50. A ratio of the area of the vertical projection S of the micro element 320 to the area of the vertical projection W of the adhesive portion 120 is between 1 and 3. An exemplary ratio ranges from 1.5 to 2. If the area of the vertical projection W of the adhesive portion 120 is too large, the adhesive portion 120 may easily adhere to a neighboring good micro element 320; and if the area of the vertical projection W of the adhesive portion 120 is too small, the removal force for a flaw 320D is possibly not enough. However, the disclosure is not limited thereto. It should be noted that the present embodiment takes one adhesion device 100 as an example for exemplary description, and is not indicative that the disclosure is limited to content disclosed in the drawings.

Figure 7:
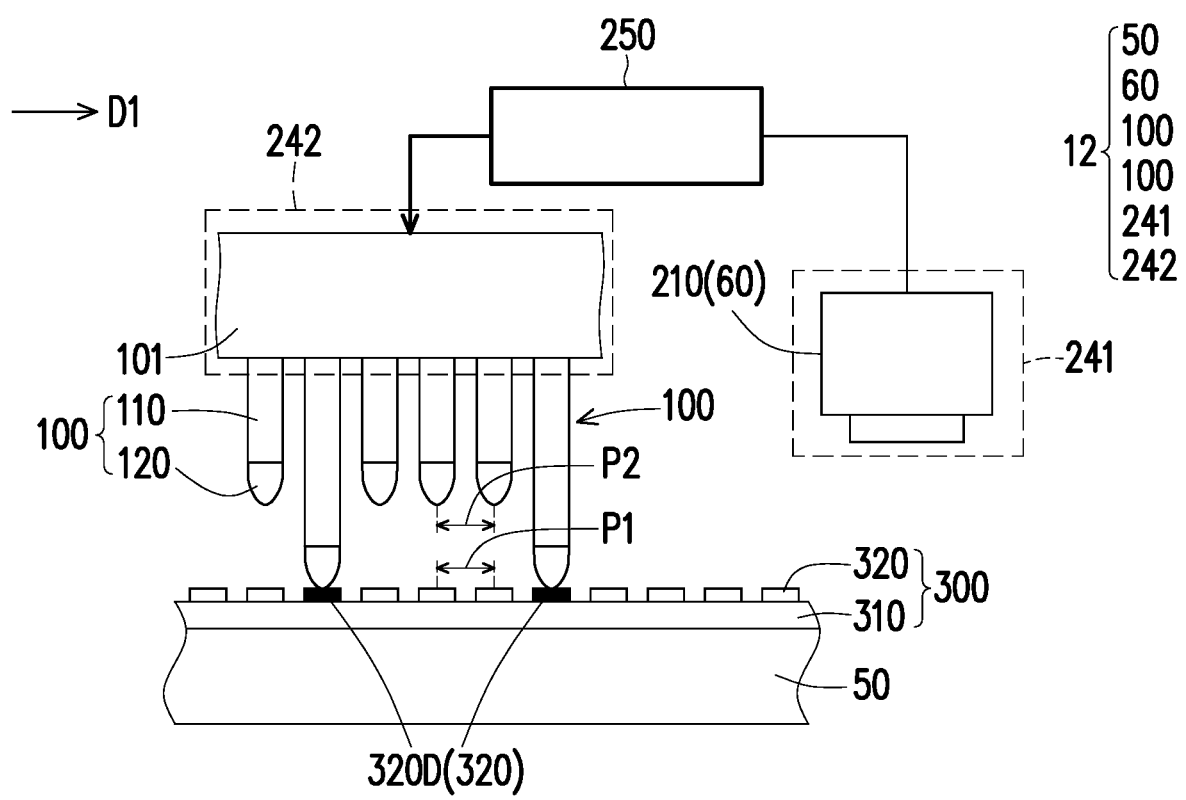
FIG. 7 is an operation schematic diagram of an adhesion device according to the third embodiment of the disclosure.

FIG. 7 is an operation schematic diagram of an adhesion device according to the third embodiment of the disclosure. Referring to FIG. 7, a main difference between micro device optical inspection and repairing equipment 12 of the present embodiment and the micro device optical inspection and repairing equipment 11 of FIG. 6 lies in the number and actuation mode of the adhesion devices 100. In the present embodiment, the micro device optical inspection and repairing equipment 12 has multiple adhesion devices 100, and these adhesion devices 100 are disposed on a carrier 101 and arranged in an array.

For example, in direction D1, any two adjacent micro elements 320 are arranged on the substrate 310 at a first interval P1, and any two adjacent adhesion devices 100 are arranged on the carrier 101 at a second interval P2. In the present embodiment, the second interval P2 is substantially equal to the first interval P1, but the disclosure is not limited thereto. In another embodiment, the second interval P2 may also be greater than the first interval P1. The first interval P1 and the second interval P2 may be adjusted for actual needs, as long as a flaw adhering to one adhesion devices 100 may not structurally interfere with another one adhesion devices 100 being adjacent to the flaw. It should be particularly noted that in step S405 of the optical inspection and repairing method (as illustrated in FIG. 2), the micro device optical inspection and repairing equipment 12 may simultaneously remove multiple flaws 320D through multiple adhesion devices 100, so that the inspection and repairing time of a micro element wafer t 300 may be effectively shortened, and the accuracy of removal of the flaws 320D may also be improved.

Figure 8:
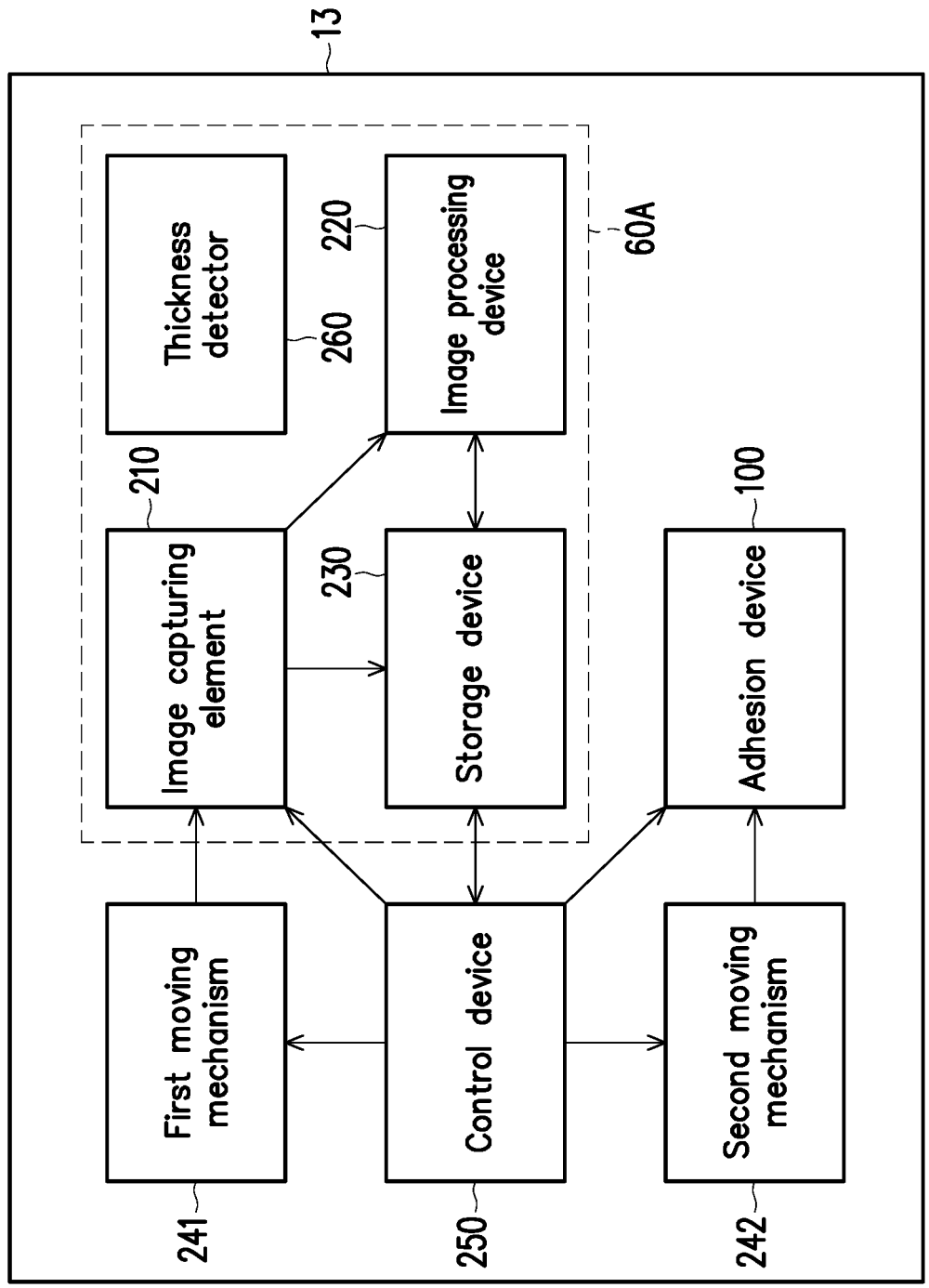
FIG. 8 is a block diagram of micro device optical inspection and repairing equipment according to the fourth embodiment of the disclosure.

FIG. 8 is a block diagram of micro device optical inspection and repairing equipment according to the fourth embodiment of the disclosure. Referring to FIG. 8, a main difference between the micro device optical inspection and repairing equipment 13 of the present embodiment and the micro device optical inspection and repairing equipment 11 of FIG. 5 lies in constitutions of the optical inspection modules. In the present embodiment, an optical inspection module 60A may also include a thickness detector 260. The thickness detector 260 here is, for example, a white light interferometer, and may be used to obtain thickness information (such as step height) of micro element of an object under test on a carrying stage. and thickness distribution information (such as film thickness uniformity or surface roughness) of the object under test.

Based on the above, in the micro device optical inspection and repairing equipment and optical inspection and repairing method of one embodiment of the disclosure, the optical inspection module is used to perform optical inspection on the object under test to obtain the position coordinate of the flaw, which is conducive to ensure a positioning relationship between the adhesion device and the flaw, thereby improving the accuracy of the flaw removal. In another aspect, the flaw can be effectively removed from the object under test through an adhering relationship between the adhesion device and the flaw so as to increase the repair yield, thereby improving the overall yield of the post-process.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. N optical inspection and repairing method, comprising:
providing micro device optical inspection and repairing equipment, comprising a carrying stage, an optical inspection module and at least one adhesion device, wherein the optical inspection module is arranged corresponding to the carrying stage so as to capture image information and obtain a position coordinate from the image information, and the adhesion device comprises a main body and an adhesive portion connected to the main body;
placing an object under test on the carrying stage of the micro device optical inspection and repairing equipment;
performing an optical inspection on the object under test with the optical inspection module to determine if a flaw existed in the object under test;
obtaining the position coordinate of the flaw which is determined by the optical inspection module;
moving the adhesion device over a target position, which corresponds to the position coordinate of the flaw, on the carrying stage, wherein the main body of the adhesion device is adapted to drive the adhesive portion to move to the target position along a moving axis, so that the flaw is adhered with the adhesive portion and then removed from the object under test; and
performing ultrasonic cleaning on the adhesion device to remove the flaw from the adhesion device.

2. The optical inspection and repairing method according to claim 1, further comprising:
determining the cleanliness of the adhesion device; and
drying the adhesion device after determining that the adhesion device is not adhered with any flaw.

3. He optical inspection and repairing method according to claim 1, wherein the object under test is a micro element wafer and comprises:
a substrate; and
a plurality of micro elements arranged on the substrate, wherein the flaw is bad one of the micro elements.

4. He optical inspection and repairing method according to claim 3, wherein the object under test further comprises a cushion layer arranged between the substrate and the plurality of micro elements.

* * * * *